United States Patent [19]

Nishizawa

[11] 4,266,238
[45] May 5, 1981

[54] SEMICONDUCTOR DEVICE HAVING HIGH-SPEED OPERATION AND INTEGRATED CIRCUIT USING SAME

[75] Inventor: Jun-ichi Nishizawa, Sendai, Japan

[73] Assignee: Zaidan Hojin Handotai Kenkyu Shinkokai, Sendai, Japan

[21] Appl. No.: 884,214

[22] Filed: Mar. 7, 1978

[30] Foreign Application Priority Data

Mar. 11, 1977 [JP] Japan .................................. 52/27377
Apr. 23, 1977 [JP] Japan .................................. 52/47263

[51] Int. Cl.³ ............................................ H01L 27/04
[52] U.S. Cl. ........................................ 357/48; 357/23;
357/34; 357/36; 357/41; 357/43; 357/46;
357/50; 357/58
[58] Field of Search ...................... 357/23, 34, 36, 41,
357/43, 46, 48, 50, 58

[56] References Cited
PUBLICATIONS

IEEE-vol. Ed.-22, No. 4, Apr. 1975, Nishizawa et al.

Primary Examiner—Edward J. Wojciechowicz
Attorney, Agent, or Firm—Cushman, Darby & Cushman

[57] ABSTRACT

An improved transistor comprising an embedded electrode formed in a semiconductor substrate and having a high resistivity semiconductor region intervening between the embedded electrode and the substrate. The dimension and the impurity concentration of the high resistivity region are selected to insure that this latter region is substantially pinched off in the operative state of this transistor by the depletion layer growing from either the embedded electrode or the substrate, the width of said depletion layer varying in good faith without delay with the quick changes in the voltage of the embedded electrode. This provides an effective reduction mainly in the capacitance between the embedded electrode and the substrate, and also in the conductance in high-speed operation, which jointly bring about a high speed operation and a large driving ability. This transistor is extremely useful when adopted in a semiconductor integrated circuit.

30 Claims, 22 Drawing Figures

NOR $\overline{A+B}$

SEMICONDUCTOR DEVICE HAVING HIGH-SPEED OPERATION AND INTEGRATED CIRCUIT USING SAME

BACKGROUND OF THE INVENTION (a) Field of the Invention

The present invention relates to a semiconductor device, and more particularly it pertains to a transistor which provides high speed operation without sacrificing the effective characteristics of the whole device which incorporates such transistors, and it further concerns an integrated circuit structure using these transistors.

(b) Description of the Prior Art

In conventional integrated logic circuits, known bipolar transistors have been adopted, in spite of their large power dissipation, due to the characteristics of these bipolar transistors such as, for example, large transconductance, high-speed operation and large driving ability. For these reasons, bipolar transistors have been used in, for example, those computing sections of a semiconductor integrated circuit which are required to operate at high speed, and also as elements constituting interface portions between integrated circuits which require a large driving ability.

Semiconductor devices or integrated circuits which employ known such bipolar transistors as stated above, include the so-called emitter-coupled logic (ECL), emitter-follower logic (EEL), non-threshold logic (NTL), integrated injection logic (IIL), diode transistor logic (DTL), a resistor transistor logic (RTL), dynamic random access memory (D-RAM), static random access memory (S-RAM), read-only memory (ROM) and like devices.

FIG. 1A shows a diagrammatic cross-sectional view of a semiconductor device formed with known high-speed bipolar transistors utilizing a stepped electrode transistor (SET) structure. Because of this SET structure, the distance between an emitter region 5 and a base region 4 can be greatly reduced, and thus the area which is occupied by the base region 4 and the area occupied by the collector region 2 can both be reduced substantially. Accordingly, so-called base resistance, the base-collector capacitance and the collector-substrate capacitance can each be reduced, thereby the operation speed of this semiconducted device can increase. This semiconductor device comprises: a substrate 1 constituted by a p type region, an embedded collector region 2 constituted by an n+ type region having an impurity concentration of about $10^{18}$ to $10^{20}$ cm$^{-3}$, an n type region 3 having an impurity concentration of about $10^{14}$ to $10^{17}$ cm$^{-3}$, a base region 4 constituted by a p type region having an impurity concentration of about $10^{17}$ to $10^{18}$ cm$^{-3}$, an emitter region 5 constituted by an n+ type region having an impurity concentration of about $10^{20}$ to $10^{21}$ cm$^{-3}$, an insulator region 6, a doped polycrystalline silicon region 7, and electrodes 2', 4', 4'' and 5'. In this known semiconductor device, the isolation of each transistors is accomplished by the p type region. This isolation may be carried out by relying on the IOP (Isolated by Oxide and Polycrystalline Silicon) technique which employs polycrystalline silicon, or by relying on the Isoplanar Isolation technique which employs an insulating material such as silicon oxide ($SiO_2$). This kind of bipolar transistors of an SET type can be applied to a non-threshold logic (NTL) circuit of FIG. 2 which is said to be able to provide the highest operation speed at the present state of techniques.

FIG. 2 shows a diagrammatic circuit of an non-threshold logic (NTL) circuit, to which the conventional semiconductor device of FIG. 1 is applicable. According to the experiment conducted by the inventor by incorporating the above-said bipolar transistors in non-threshold logic (NTL) circuit to form a 15-stage ring oscillator, there has been measured a transfer delay time of 85 picoseconds (refer to Technical Digest of ISSCC 77, FAM 16.1, T. SAKAI et al "A 100 Pico-Second Bipolar Logic" pp. 196-197). This high speed operation is attributable to the fact that the base resistance and the base-collector capacitance are reduced. However, in such a high speed semiconductor device capable of making a high speed, the electric characteristics of the region located between the collector region 2 and the substrate 1 present an important problem that must be solved.

By referring to FIGS. 1A and 2, the emitter potential $V_{EE}$ of this semiconductor device is supplied through a resistor $R_2$ and a parallel capacitor $C_1$ to the emitters of two bipolar transistors, respectively. This emitter potential $V_{EE}$ is usually set at about $-1.1$ V.

The substrate 1, which in this example is of p type, of the semiconductor device in FIG. 2 is usually kept at the ground potential. The impurity concentration of this substrate 1 is selected to be low, for example about $10^{14}-10^{16}$ cm$^{-3}$, for the purpose of decreasing the capacitance between the collector region 2 and the substrate 1. The lower the impurity concentration of the p type substrate is, the smaller the capacitance between the collector region 2 and the substrate 1 becomes. Furthermore, the width of the depletion layer, which in this example extends from the collector region 2 toward the substrate 1, will vary in accordance with the changes in the voltage which is applied to the collector region 2. However, if the impurity concentration of the substrate 1 is lowered, the variations of the width of this depletion layer growing between the collector region 2 and the substrate 1 will become unable to quickly respond to quick changes in the voltage which is applied to the collector region 2. This time delay which occurs in the variation of the width of the depletion layer will bring about drawbacks and inconveniences which will be discussed below. In the event that such time delay exists, it may be viewed as if a conductance has appeared between the collector region 2 and the substrate 1 in parallel with the capacitance between the collector region 2 and the substrate 1 during the high speed operation, i.e. against quick changes in the collector voltage, and this brings about a degradation of the characteristics of said transistor in its high speed operation (refer to Semiconductor Electronics Vol. 13, Chapter 4, Takahiro OHMI, "TUNNETT" Microwave and Millimeter-Wave Oscillation). Therefore, if the impurity concentration of the substrate is lowered in an effort to reduce the collector-substrate capacitance, an undesirable increase in the share of contribution by the conductance will result. On the other hand, an effort to reduce this contribution shared by the conductance by an increase in the impurity concentration of the substrate will undesirably result in an increase in the collector-substrate capacitance which, in turn, deteriorates the frequency characteristic of the transistor.

The occurrence of such deterioration in the frequency characteristic of the transistor is not limited in planar bipolar transistors, but will develop in all those transistors, such as static induction transistors (SIT), junction field effect transistors as well as MOS field effect transistors, which have an embedded electrode and which are such that the potential of this embedded electrode is adapted to vary in the operative state of these transistors.

Furthermore, the deteriorating behavior of the depletion layer of a semiconductor device discussed above will be described in further detail hereinbelow by referring to FIGS. 1B and 1C.

Usually, an embedded electrode region is formed in a substrate 1 having a conductivity type opposite to the conductivity type of said embedded region, and forms a p-n junction therebetween. The potentials of the substrate 1 and the embedded electrode 2 are so selected that said p-n junction are reversely biased in the operative state of the semiconductor device. The potential of the substrate 1 is kept constant. However, the potential of the embedded electrode 2 will vary in the operative state. For example, in case of a transistor which is used especially as a transistor intended for switching operation, the potential of the embedded electrode of such transistor will vary between two predetermined potential values. If the potential of the embedded electrode 2 changes slowly or gently, the width of the depletion layer growing from the embedded electrode 2 toward the substrate 1 will change immediately in response to such slow or gentle potential change of the embedded region. However, if the speed of the potential change of the embedded region, or in other words, the switching speed for example, becomes greater, the variation speed of the width of the depletion layer will cease to follow the quick potential changes of the embedded region. As a consequence, the region between the embedded electrode region 2 and the substrate 1 will no longer be equivalent to a mere capacitance due to the depletion layer contained between the region 2 and the substrate 1, but rather will be equivalent to the combination of a conductance has become to be in parallel to the capacitance. Simple models of such instance will be shown hereunder by utilizing small signal approximation and with respect to structure and dimension of semiconductor device.

FIGS. 1B and 1C are a diagrammatic structure of a bipolar transistor and its equivalent circuit, respectively. The semiconductor device of FIG. 1B comprises an n+ type embedded electrode region 2 having an area of $1.75 \times 10^{-5}$ cm$^2$ (which generally corresponds to a collector area of a bipolar transistor relying on the Isoplanar technique), a p type substrate having a thickness of 300 μm, and an electrode region 11 provided on the substrate 1. Furthermore, let us assume that a reverse bias of 1 V is applied between the n+ type embedded electrode region 2 and the electrode region 11 of the substrate 1. In FIG. 1C, this circuit comprises a capacitance C which is produced by the depletion layer and a resistance r formed by an electrically neutral region in the substrate 1. In this structure, when the impurity concentration $N_D$ of the substrate 1 is selected to be $1 \times 10^{14}$ cm$^{-3}$, the capacitance C and the resistance r will become 0.038 pF (pico-Farad) and 11 kΩ (kilo-ohms), respectively. Also, in case the impurity concentration is selected to be $1 \times 10^{15}$ cm$^{-3}$, the capacitance C and the resistance r will be 0.12 pF and 1.1 kΩ, respectively. In these instances, the time constant rc will be 0.41 nano-second and 1.13 nano-second, respectively.

If it is intended that this semiconductor device effect switching operation at a speed less than 1 nano-second, i.e. is a so-called sub-nano-second device, the state of this semiconductor device will become equivalent to the state as if there is connected a resistance of 11 kΩ or 1.1 kΩ, depending on the above-mentioned two instances (which, as conductance, corresponds to 93 micro-mho (μν) or 930 μν) between the embedded electrode region 2 and the substrate 1.

On the other hand, since the current which flows through a such transistor is typically of the order of several hundred micro-amperes, the resistance of the transistor will be approximately several kilo-ohms. This means that the resistance which appears between the embedded electrode region 2 and the substrate 1 is almost identical in magnitude to that of the transistor itself. Therefore, such condition is as if the transistor contains a very large load within itself. As a result the gain of the transistor will decrease markedly, and consequently its operation speed will drop sharply.

SUMMARY OF THE INVENTION

It is, therefore, an object of the present invention to provide a semiconductor device which is free of those drawbacks and inconveniences as described above of known transistors, which has improved characteristics, which is capable of performing high-speed operation and which has an improved driving ability.

Another object of the present invention is to provide a semiconductor device of the type described above, which has a high resistivity semiconductor region formed between an embedded electrode region and the substrate, said high resistivity region being arranged so that this region is substantially pinched off in the operative state of the semiconductor device by the depletion layer growing from either the embedded electrode or the substrate, the width of said depletion layer varying in good faith without delay, with the changes in the voltage of the embedded electrode, whereby high-speed operation and a large driving ability of the device is ensured.

Still another object of the present invention is to provide a semiconductor device of the type described above, which, when applied to planar bipolar transistors, static induction transistors, junction field effect transistors and MOS field effect transistors of the type having an embedded electrode whose potential varies in the operative state of these transistors, will develop improved high-speed operation and improved driving ability, without substantially sacrificing the operation characteristics of these semiconductor devices.

A further object of the present invention is to provide an integrated circuit structure formed by the use of the semiconductor device of the type described above for further improving high-speed operation of the circuit as well as the operation characteristics of the circuit.

According to one aspect of the present invention, there is provided a semiconductor device comprising a first semiconductor region of a certain high impurity concentration for allowing a main current flow, a second semiconductor region of a certain high impurity concentration, and a third semiconductor region disposed between said first and second semiconductor regions, said third semiconductor region having such dimension and such impurity concentration lower than that of said first and second semiconductor regions that will cause this third semiconductor region to become substantially pinched off by the depletion layer growing between said first and second semiconductor regions in the main operative state of the semiconductor device, said first semiconductor region and said second semiconductor region having opposite conductivity types relative to each other.

This semiconductor device provides a very high-speed operation and is capable of substituting for any transistors having embedded electrodes, the potential of which is to be changed in the operative state in a given circuitry.

According to another aspect of the present invention, there is provided a semiconductor integrated circuit structure comprising a multiplicity of semiconductor elements at least one of which comprises a first semiconductor region of a certain high impurity concentration for allowing a main current flow, a second semiconductor region of a certain high impurity concentration, and a third semiconductor region disposed between said first and second semiconductor regions, said third semiconductor region having such dimension and such impurity concentration lower than that of said first and second semiconductor regions that will cause third semiconductor region to be substantially pinched off by the depletion layer growing between said first and second semiconductor regions in the main operative state of the semiconductor device, said first semiconductor region and said second semiconductor region having opposite conductivity types relative to each other.

These and other objects as well as the features and the advantages of the present invention will become more apparent from the following description of the embodiments of the present invention when taken in conjunction with the accompanying drawings.

BRIEF DESCRIPTION OF THE DRAWINGS

FIGS. 12 to 14 show diagrammatic cross-sectional representations of transistors according to respective embodiments of the present invention, in which:

FIG. 12 shows an instance using a static induction transistor of the junction type, FIG. 13 shows an instance using a field effect transistor of the metal oxide semiconductor type, and FIG. 14 shows an instance using a static induction transistor of the metal oxide semiconductor type.

DETAILED DESCRIPTION OF THE PREFERRED EMBODIMENTS

Figure 3:
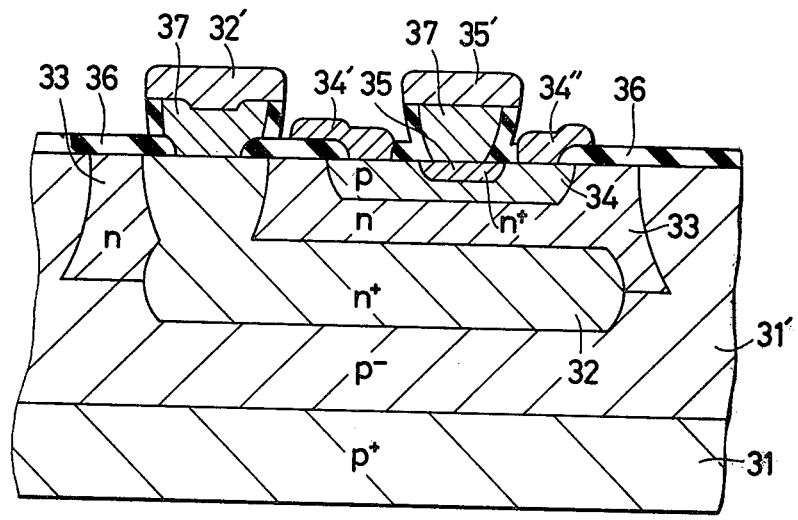
FIG. 3 shows a diagrammatic cross-sectional view of bipolar transistor structure according to an embodiment of the present invention.

FIG. 3 is a diagrammatic cross-sectional representation of a bipolar transistor structure according to an embodiment of the present invention. This bipolar transistor comprises: a $p^+$ type substrate 31 having a high impurity concentration, an $n^+$ type collector region 32, a $p^-$ type region 31' formed between this $p^+$ type substrate 31 and the collector region 32 and having a high resistivity, an n type region 33, a p type base region 34, an $n^+$ type emitter region 35, an insulator region 36, a doped polycrystalline silicon region 37 and electrodes 32', 34', 34'', 35'. The thickness of said $p^-$ type region 31' formed between the substrate 31 and the collector region 32 is so selected that the depletion layer formed by the built-in potential which is produced by the $n^+$ $p^-$ junction between the $n^+$ collector region 32 and the $p^-$ type region 31' will almost or completely reach the $p^+$ type substrate 31. For example, in case the impurity concentration of the highly resistive $p^-$ type region 31' is selected to be $1 \times 10^{13}$ cm$^{-3}$, $1 \times 10^{14}$ cm$^{-3}$ and $1 \times 10^{15}$ cm$^{-3}$, respectively, the thickness of this $p^-$ type region 31' will be selected less than about 11 μm (micrometers), about 3.7 μm and about 1.1 μm, respectively. Namely, the impurity concentration of the high resistivity $p^-$ type region 31' is lower than that of the embedded region 32 and the substrate 31 by at least two orders of magnitude. However, if the embedded collector region 32 and the substrate 31 are reversely biased, during the operation of the bipolar transistor, the impurity concentration of the $p^-$ type region need not necessarily be arranged in such a way as discussed above.

Figure 1A:
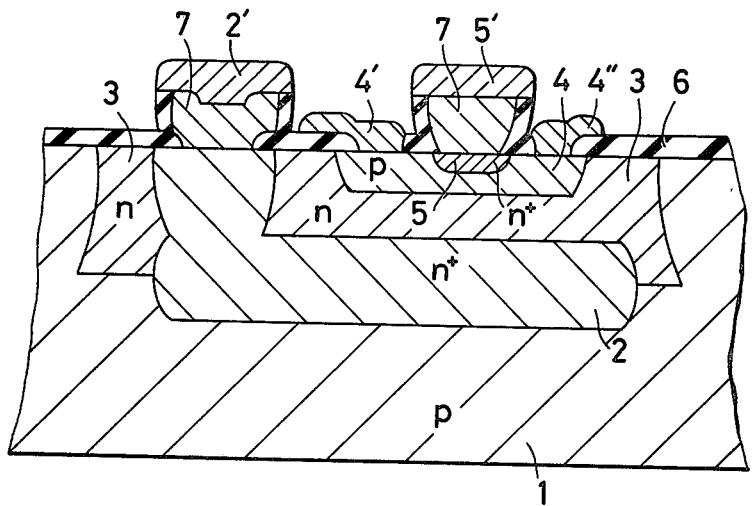
FIG. 1A is a diagrammatic cross-sectional view of a conventional bipolar transistor structure.
Figure 1B:
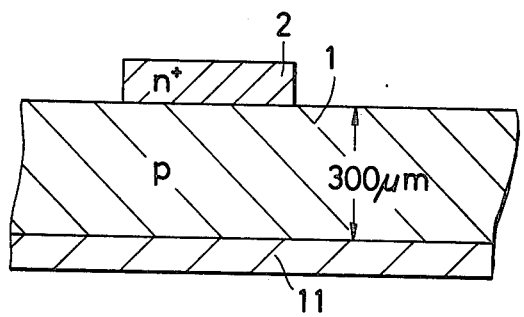
FIGS. 1B and 1C show a diagrammatic representation of a part of a conventional semiconductor structure and a diagrammatic illustration of an equivalent circuit of this semiconductor structure to explain the deteriorating behavior between the embedded electrode and the substrate.
Figure 1C:
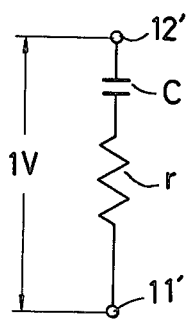
Figure 2:
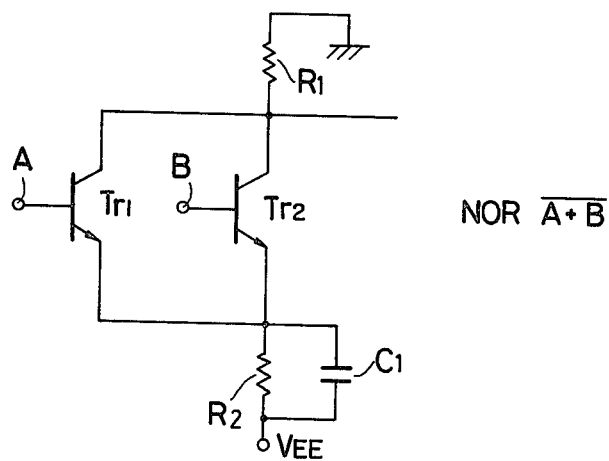
FIG. 2 shows a diagrammatic representation of an example of a known non-threshold logic circuit formed with two bipolar transistors.

If this transistor described above is incorporated in an NTL circuit as shown in FIG. 2, the collectors 32 of the transistors Tr1 and Tr2 are connected to the ground potential via a resistance $R_1$, whereas the emitters of these transistors Tr1 and Tr2 are applied with a negative potential $V_{EE}$ through a resistance $R_2$ and a capacitance $C_1$ which is provided in parallel with this resistance $R_2$. Accordingly, the potential of the collector region 32 is lower than the potential at the grounding point. As is shown in FIG. 2, the output of NOR $\overline{A+B}$ can be obtained in accordance with the inputs from the transistors Tr1 and Tr2. Furthermore, the potential of the collector region 32 is lower than that of the grounding point as stated above. In the event that there is no input from terminals A nor B, the potential of the collector region 32 is held substantially at zero volt. In case, however, there is provided an input either from the terminals A or B, the potential of this collector region 32 will change to a value of about −0.5 V. Therefore, in the circuit structure of FIG. 2, it will be understood that if the potential of the substrate 31 is kept at the same potential as the ground potential, the collector region 32 and the substrate 31 will be forward biased. Accordingly, the width of the depletion layer will be reduced to about 70 percent of that width of the depletion layer produced by the built-in potential. As such, it is necessary that the thickness of the p− type region 31' be arranged to be thinner so as to correspond to this reduction in the width of the depletion layer. In this structure, the capacitance between a collector region 32 and a substrate 31 is set to be sufficiently small, and also this structure is arranged so that the depletion layer which grows, in this instance, from the collector region 32 toward the substrate 31, in this example, will not expand or shrink so as not to contain the deteriorating electrical characteristic of conductance mentioned previously, whereby the characteristics of this bipolar transistor will not deteriorate during its high-speed operation.

It will be understood further that also in such circuit structure as mentioned above, the substrate 31 and the collector region 32 will be reverse biased if the substrate is kept at the potential of the power source. Thus, the width of the depletion layer will expand wider than does that depletion layer produced by the built-in potential. Therefore, it will be sufficient if only the thickness of the p− type region 31 is arranged to be smaller than the width of the depletion layer produced by the built-in potential, but in some instances this thickness may be even greater than said width. In short, the region located between the collector region 32 and the substrate 31 need only be arranged to be in a substantially pinched-off state.

To minimize the deterioration of characteristics of the bipolar transistor attributable to the conductance which develops due to high-speed changes in the voltage between the collector region 32 and the substrate 31, it will be advantageous, in the above-mentioned circuit, to keep the potential of the substrate 31 at the potential of the power source. However, in a circuit arrangement that the emitter side is connected to the ground potential, it will be advantageous to keep the potential of the substrate 31 at the ground potential.

If arrangement is provided so that the depletion layer which grows from the collector region 32 toward the substrate 31 is always substantially contacting the p+ type substrate region 31 for any change in the collector potential, the aforementioned conductance in the transistor (which prevents by the fact that the speed of variation of the depletion layer from immediately following quick changes in the collector potential) will not develop. Thus, there will develop no deterioration of characteristics caused by such conductance between the collector region 32 and the substrate 31, however quickly the collector potential may change. Usually, the thickness of the n type region 33 is about 1 to 2 μm (micrometers). Therefore, if the thickness of the p− type region 31' is arranged to be greater than 4 to 5 μm, the capacitance between the collector region 32 and the substrate 31 can be markedly reduced as compared with the capacitance between the collector region 32 and the base region 34. In many cases of conventional transistors, the capacitance between the collector region 32 and the substrate 31 is greater than that between the collector region 32 and the base region 34. In addition, in such known transistors, there tends to appear a conductance attributable to the fact that the variation speed of the width of the depletion layer is unable to immediately follow the quick changes in the collector potential. Thus, in such known transistors, there is noted a marked deterioration of characteristics of the transistors due to the aforesaid reasons related between the collector region 32 and the substrate 31.

In the transistor having the structure according to the present invention, there such deterioration of characteristics of the transistor as caused by the above-discussed electric characteristic between the collector region 32 and the substrate 31 is substantially avoided. The transistor according to the present invention can be used individually as a single transistor. However, this transistor is used mainly in integrated circuits. In such an instance, it should be understood that the parasitic capacitance can be all the more reduced by relying on the IOP method or the Isoplanar method in effecting isolation between the respective transistors employed in the integrated circuit. Further, the conductivity types of the respective semiconductor regions in the integrated circuit may be completely reversed.

When a logic gate of an NTL circuit shown in FIG. 2 is formed using bipolar transistors constructed as shown in FIG. 3, the high-speed operation ability of the circuit will be made all the more prominent, and the power dissipation will be significantly minimized.

Figure 4:
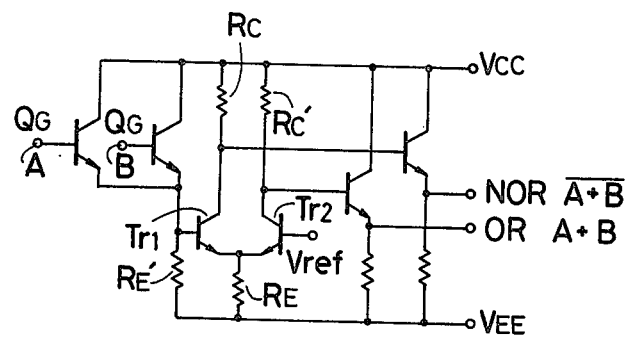
FIG. 4 shows a diagrammatic explanatory circuit representation of an example of NOR/OR gate circuitry to which the present invention is applicable.

FIG. 4 shows a diagrammatic representation of an example of an emitter-coupled logic (ECL) circuit. The ECL circuit is operated at a high speed of course but is not so high as that of the NTL circuit of FIG. 2. The bipolar transistor of FIG. 3 according to an embodiment of the present invention can also be effectively used in the aforesaid ECL circuit. In a known ECL circuit comprising transistors having emitters of 1 micrometer width and being of the silicon oxide (SiO₂) isolation of the Walled base type, a delay time of 0.4 nano-second per gate has been reported.

The ECL circuit shown in FIG. 4, includes two transistors Tr1 and Tr2 which are provided centrally of the whole circuitry. The collectors of these two transistors are connected to the resistor Rc and Rc', respectively. It is only these two transistors that are affected by the electric nature between the collector region and the substrate. More particularly, the potentials of the respective collectors connected to a power source $V_{cc}$ via the resistors Rc and Rc', respectively, in these transistors Tr1 and Tr2 will change in the operative state of these transistors. Thus, the effect of the electric characteristic between the collector region and the substrate will appear. Also, a CML (current mode logic) circuit having the arrangement which lacks the emitter follower part of the output stage in the circuitry of FIG. 4 has become frequently used of late for high-speed operations. It should be understood that the employment, in such high-speed logic circuitry discussed above, of a bipolar transistor as the one stated above having a high resistivity region between the collector region and the substrate will accelerate the high-speed operating ability all the more. It will be easily understood that the transistor of FIG. 3 can be used also in other types of logic circuits such as TTL circuit and the like.

Bipolar transistors are used also in the interface circuit part of an integrated circuit to interface with an external circuit, in addition to the use in that part which operates at a high speed as mentioned already. With respect to an input section of an integrated circuit, for example, the interface circuit is composed of an inverter circuit and is required to transmit an input signal or to deliver a clock pulse to a plurality of gates contained in a semiconductor integrated circuit in accordance with an input signal received from an external circuit. Also, at the input section of memories in an integrated circuit, an inverter which constitutes an interface circuit has to drive a decoder which, in turn, controls the word lines and the bit lines of the memories. As such, the inverter circuit which is employed in the input interface circuit section of an integrated circuit is required to have a very great driving ability. Similarly the interface circuit in the output section of an integrated circuit, in which an external circuit is usually composed of TTL (Transistor-transistor logic) gates, there is required a very large current as large as 1.6 milli-amperes for example, for driving the circuitry. In this case, also, an inverter circuit having a sufficiently great ability of driving an integrated circuit is required.

Figure 5:
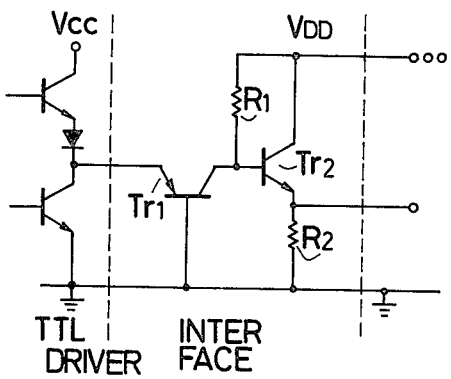
FIG. 5 is a diagrammatic explanatory circuit, representing an example of an interface circuit to which the present invention is applicable.

FIG. 5 shows a diagrammatic circuit to represent an example of interface circuit which is provided between an external circuit driven from a TTL gate circuit and the input section of a semiconductor integrated circuit constituted by MOS type field effect transistors, or static induction transistors (SIT) including MOS type SIT. This diagrammatically illustrated circuit comprises a TTL driver circuit shown on the left outer side of the chain line given on the left side of FIG. 5, and an interface circuit section which is composed by elements shown between the two chain lines, i.e. by two bipolar transistors Tr1 and Tr2 and by resistances $R_1$ and $R_2$. The portion located on the right outer side of the chain line given on the right side represents an integrated circuit, but it is not specifically depicted here, and only two output terminals from the interface circuit are seen. In this instance, the transistors described with respect to FIG. 3 can be effectively applied in the interface circuit to enhance high-speed operation as well as great driving ability of the integrated circuit. Moreover, with the aid of the transistors of the type shown in FIG. 3, wherein a bipolar transistor is formed on top of a low impurity concentration region which is formed on a substrate having a high impurity concentration, it becomes extremely easy to manufacture an integrated circuit of SIT's.

Figure 6:
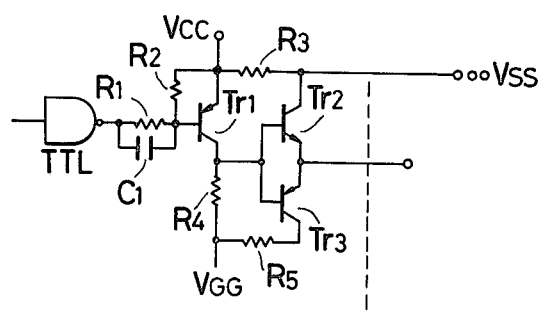
FIG. 6 is a diagrammatic explanatory circuit representation of an example of a clock circuit to which the present invention is applicable.

FIG. 6 shows a diagrammatic illustration of a circuit of an example of clock circuit for delivering clock pulses to an integrated circuit constituted by MOS field effect transistors or SIT's. This clock circuit is driven by a TTL gate circuit and is composed of three transistors Tr1, Tr2 and Tr3, a capacitor $C_1$ and resistors $R_1$, $R_2$, $R_3$, $R_4$ and $R_5$. It should be appreciated here again that if these transistors Tr1, Tr2 and Tr3 are those transistors shown in FIG. 3, the operation speed as well as the driving ability of the clock circuit will be greatly enhanced, with the result that the high-speed operation and the driving ability of the integrated circuit are greatly improved.

Figure 7:
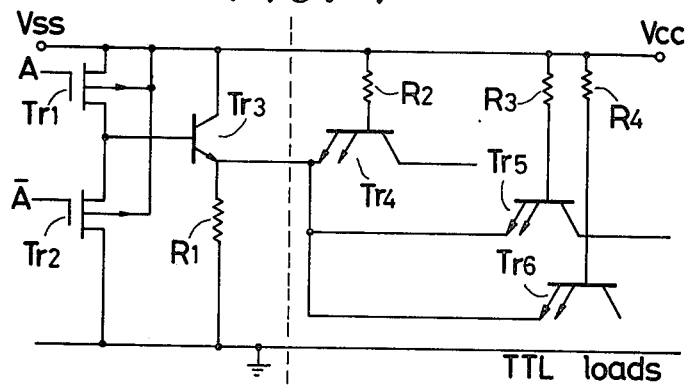
FIG. 7 shows an explanatory circuit diagram representing another example of interface circuit, embodying the present invention.

FIG. 7 shows a diagrammatic representation of a circuit of another example of the interface circuits. In this example, an external TTL circuit shown in the right half of the drawing is driven by the integrated circuit composed of two MOS-type field effect transistors Tr1 and Tr2 through the interface circuit composed by a single bipolar transistor Tr3 and a resistor $R_1$. As mentioned above, this bipolar transistor Tr3 of FIG. 3 can be advantageously used in the interface circuit to obtain high speed operation and enhanced driving ability by only a single transistor Tr3.

Figure 8A:
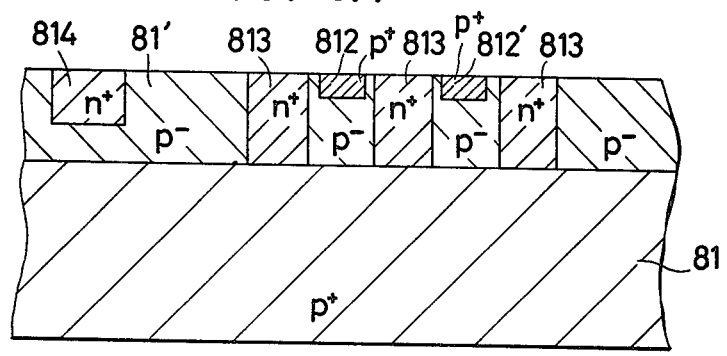
FIGS. 8A to 8D show a diagrammatic structure of a static induction transistor inverter circuit of the integrated injection logic type and a corresponding equivalent circuit, respectively, embodying the present invention.
Figure 8B:
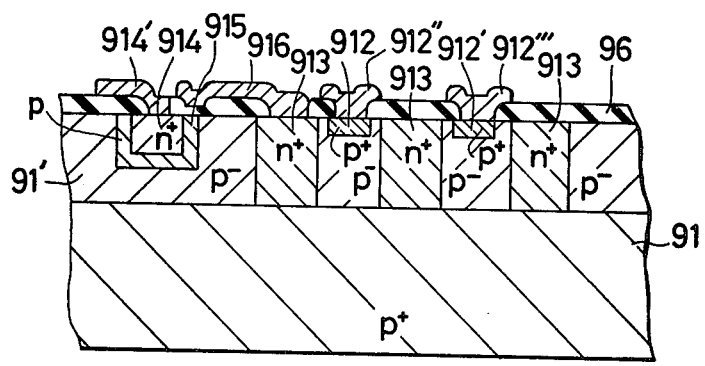
Figure 8C:
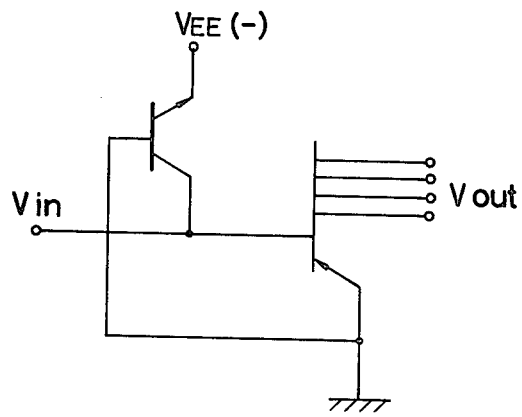
Figure 8D:
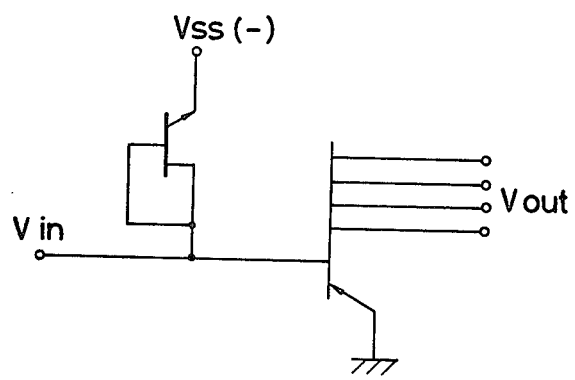

FIGS. 8A to 8D are diagrammatic representations of structures and circuits to show an SIT inverter circuit of an integrated injection logic (IIL) type. Of these drawings, FIGS. 8C and 8D diagrammatically represent equivalent circuits of the integrated device structures shown in FIGS. 8A and 8B, respectively. The structure of FIG. 8A is composed by an injector of a bipolar transistor, and the driver of a junction-type SIT, whereas the structure of FIG. 8B is composed by an injector of a MOS-SIT and the driver of a junction-type SIT. In FIG. 8B, the gate region 913 of the MOS-SIT is set at a same voltage as that of the drain region 912. It should be understood, however, that, depending on the type of structure employed, it is equally possible to arrange so that the voltage which is applied to the gate region 913 is at the same level as that of the potential of the source region 91, or further to arrange so that the gate region 913 is given a voltage from an independent power source. In FIGS. 8A and 8B, there are shown two drain regions 812, 812' and 912, 912', respectively. It should be appreciated that there are provided other two drain regions formed perpendicular to the surface of the drawing sheet, respectively, though not shown.

The integrated circuit structure of FIG. 8A is comprised of an $n^+$ type region 814 which is the emitter region of a lateral npn-type bipolar transistor, an $n^+$ type region 813 which is the collector region of said lateral npn-type bipolar transistor and at the same time serves as the gate region of the SIT, a $p^+$ type region 81 which serves as the source region of the SIT, $p^+$ type regions 812 and 812' which are the drain regions of this SIT and a $p^-$ type region 81' which constitutes the channel of the SIT and at the same time serves as the base of the lateral bipolar transistor. In the diagrammatic structure of 8A, the so-called electrode region is omitted for simplicity's sake.

FIG. 8B has a structure somewhat similar to that of FIG. 8A. However, the insulator regions 96 are formed by either silicon oxide ($SiO_2$) or silicon nitride ($Si_3N_4$) or aluminum oxide ($Al_2O_3$) or the like individually, or by any combination of these various insulating layers, as required. In this structure shown, the distance between the p type region 915 and the $n^+$ type region 913 is selected so as to insure that the region 91' located between the p type region 915 and the $n^+$ type region 913 is almost completely depleted by the built-in potential produced by the $n^+$ $p^-$ junction formed with the $n^+$ type region 913 and the $p^-$ type region 91'. The impurity concentration of these respective regions are as follows. The $p^+$ type region 91 has an impurity concentration of about $10^{17}$ to $10^{20}$ cm$^{-3}$; that of the $p^-$ type region 91' has a value of about $10^{12}$ to $10^{16}$ cm$^{-3}$; that of the $p^+$ type region 912 is about $10^{18}$ to $10^{21}$ cm$^{-3}$; that of the $n^+$ type region 913 is about $10^{15}$ to $10^{20}$ cm$^{-3}$; the $n^+$ type region 914 is about $10^{17}$ to $10^{21}$ cm$^{-3}$; and that of the p type region 915 is about $10^{14}$ to $10^{17}$ cm$^{-3}$. Among the insulator regions 96, only that portion located above the p type region 915 is formed to have a thickness thinner than the other insulating layers, being for example about 1000 Angstrohms or less, so as to control the barrier height and the width of the channel potential by the electrode 916 which is disposed on said insulator portion and connected to the $n^+$ type region 913.

By the use of both inverter circuits shown in FIGS. 8C and 8D, four fan-out signals can be taken out at the output terminals shown by $V_{out}$ as shown in FIG. 8D.

Figure 9:
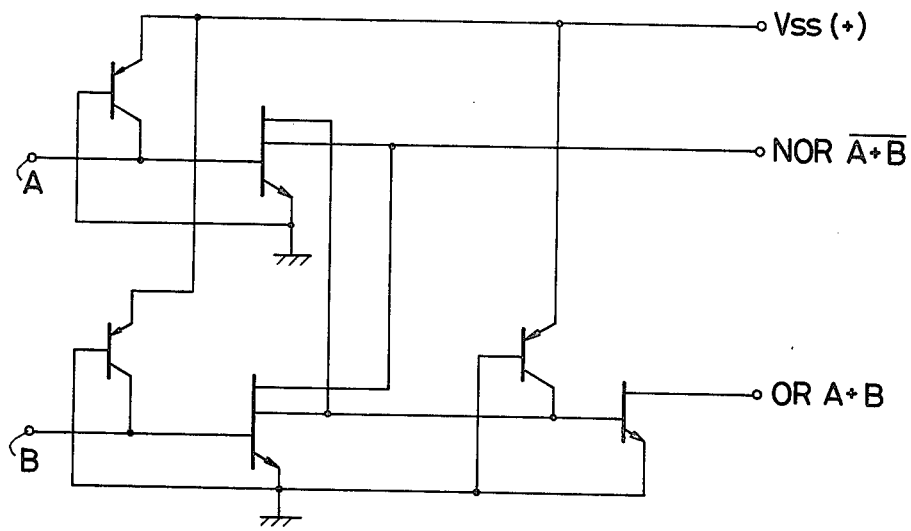
FIG. 9 is a diagrammatic explanatory circuit, representing an example of basic logic circuit, embodying the present invention.

FIG. 9 is a diagrammatic circuit of an example of basic logic circuits constituted by OR gate and NOR gate, which OR gate and NOR gate, in turn, are comprised of a multiplicity of the inverter circuits shown in FIG. 8A and FIG. 8B, respectively. From this circuit the output signals of NOR $\overline{A+B}$ and OR $A+B$ can be given through the NOR gate and the OR gate, respectively, in accordance with the input signals from signal input terminals A and B. In the circuit of FIG. 9, the conductivity types of the respective regions are completely the reverse of those of the respective parts of the circuits shown in FIGS. 8C and 8D. This circuit comprises two units of integrated injection logic (IIL) having two drain electrodes and one unit of integrated injection logic (IIL) having a single drain electrode. As discussed above, by combining a plurality of units shown in FIGS. 8C and 8D, it is possible to construct all kinds of logic gates. A similar structure of FIG. 3 can be adopted also in this circuit of FIG. 9 to enhance high-speed operation as well as great driving ability of this device.

Figure 10A:
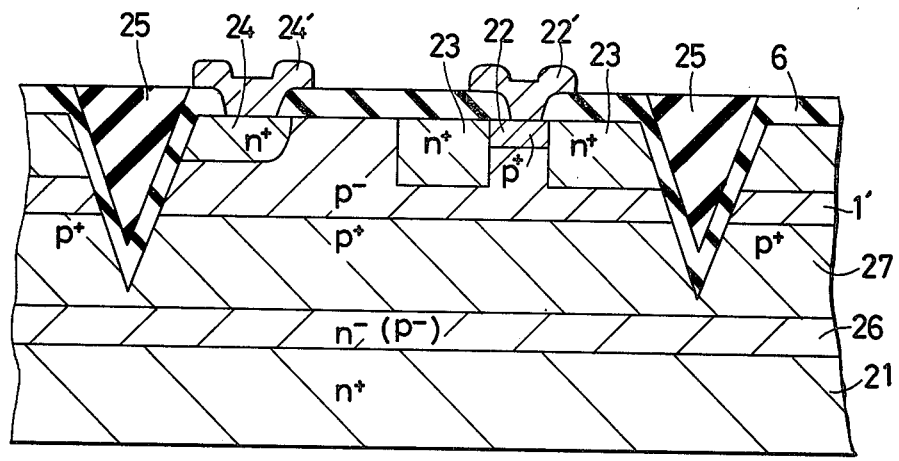
FIGS. 10A and 10B show a diagrammatic structure of an example of dynamic random access memories, and a corresponding equivalent circuit diagram, respectively, embodying the present invention.
Figure 10B:
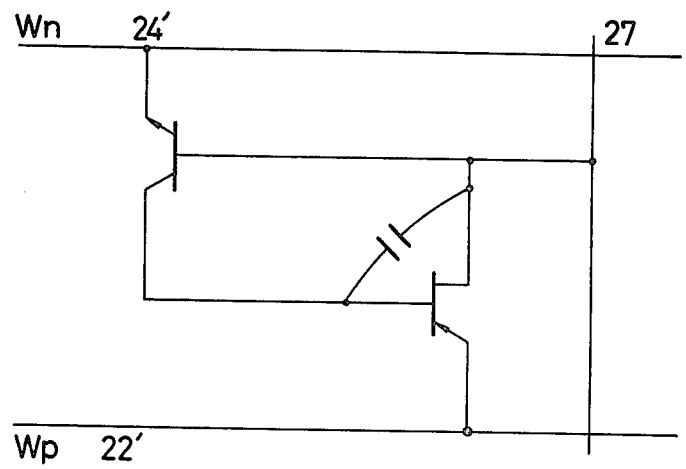

FIGS. 10A and 10B are a diagrammatic cross-section of a dynamic random access memory (D-RAM) and its equivalent circuit diagram, respectively, according to an example of the present invention. This structure can be said to be nearly similar to that of FIGS. 8A and 8B. There is provided an SIT comprising a $p^{30}$ type source region 22, an n+ type gate region 23 and a p+ drain region 27. It is known that one says that memory is "stored" or "not stored" depending on whether the charge is stored or not stored in the capacitance between the gate region 23 and the drain region 27. There is also provided a lateral bipolar transistor in the memory device. A word line of the memory device is formed by the source electrode 22' of the SIT. Also, another word line is formed by the emitter electrode 24' of the lateral bipolar transistor. A bit line of this memory device is formed by the drain region 27 of SIT which at the same time constitutes the base electrode of the lateral bipolar transistor. When the stored information in the memory is read out or written in, the potential of the bit line changes. Therefore, in this structure, an n− (p−) type high resistivity region 26 is disposed to intervene between the bit line (the p+ type region 27) and the n+ type high impurity concentration region 21, so that as mentioned previously, a structure is provided which can attain the aims of the present invention to reduce electrostatic capacity and to eliminate a deteriorating effect due to conductance. Consequently, this memory device makes it possible to carry out read-out as well as write-in operations at extremely high speed. It should be noted that, in the structure of FIGS. 10A and 10B, the lateral bipolar transistor may be substituted by an SIT or a field effect transistor.

Figure 11A:
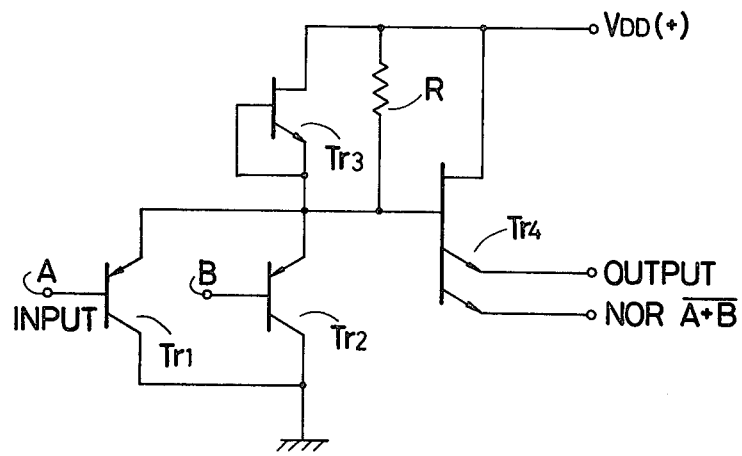
FIGS. 11A and 11B show a circuit diagram of an example of an NOR gate circuit having two input terminals, using, in combination, bipolar transistors and static induction transistors, and a corresponding diagrammatic structure, embodying the present invention.
Figure 11B:
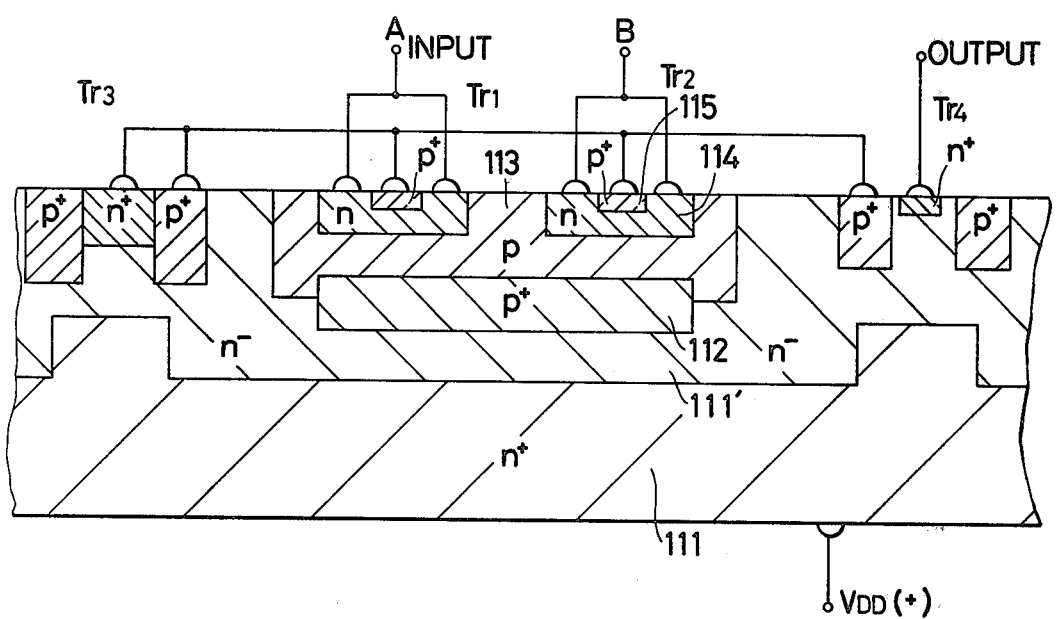

FIGS. 11A and 11B are a circuit diagram of an example of NOR gate circuits according to another embodiment of the present invention. This circuit is comprised of two pnp-type bipolar transistors $Tr_1$ and $Tr_2$ and two n-channel junction-type SIT's $Tr_3$ and $Tr_4$ and a resistor R. From the output terminals, NOR $\overline{A+B}$ output signals can be derived in accordance with the input signals supplied to two input terminals A and B. The SIT represented by $Tr_3$ is a level-setting SIT for setting the potential of the gate region of the SIT $Tr_4$ as well as the potentials of the emitter regions of the two bipolar transistors $Tr_1$ and $Tr_2$ at a desired voltage value in the operative state of the device. This SIT $Tr_3$ has such characteristics that when it has gained a predetermined voltage value across its own source and drain regions, the drain current thereof will increase abruptly. The SIT represented by $Tr_4$ is a multi-source SIT. In FIG. 11B, there is provided another source region perpendicular to the surface of the drawing sheet of FIG. 11B, although not shown. Also, a connecting region for connecting an electrode to the embedded collector region 112 of the pnp-type bipolar transistor is also formed perpendicular to the surface of the drawing sheet of FIG. 11B, though not shown either.

In this embodiment, there are provided two projections in the n+ type substrate region 111 which concurrently serves as the drain region of the two SIT's $Tr_3$ and $Tr_4$, as will be noted in FIG. 11B. These projecting portions bring about the following advantages. Since distance between the source region and the drain region is made smaller, the transit time of electrons between said source region and said drain region is shortened, and at the same time the depletion layer growing from the p+ type gate region toward the n+ type drain region 111 is enabled to easily deplete the channel region. If, however, a very high speed operation of the device is not needed and if the length of the channel is made sufficiently small, these projections may be omitted.

In this circuit, since the potential of the gate region of the transistor $Tr_4$ is close to $V_{DD}$ at the absence of input signal at the terminals A and B, this transistor $Tr_4$ is rendered to its conductive state. However, whenever an input is supplied to either one or both of the terminals A or B, the transistor $Tr_4$ is rendered to its non-conducting state.

In the structure shown in FIG. 11, the collector region of the bipolar transistor region and the drain region 111 of the SIT region are kept at a constant voltage respectively during the operative state of the device. Also, there is inserted a high resistivity region 111' between the substrate 111 and the collector regions of the bipolar transistor $Tr_1$ and $Tr_2$, the potential of which regions varies in the operative state of the device. Thus a very high-speed operation can be accomplished by this circuit.

Figure 12:
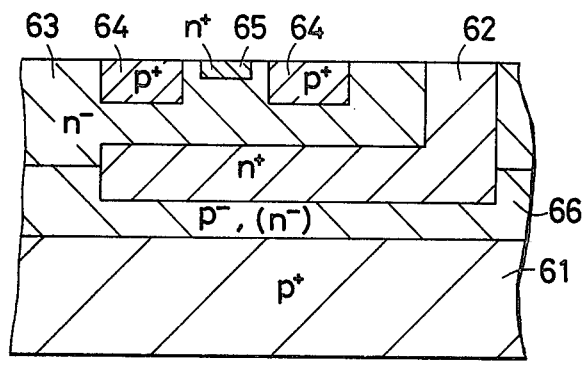

Description of the present invention has been made with respect mainly to bipolar transistors. It should be understood, however, that the present invention is not limited to bipolar transistors, but also it can be equally effectively applied to static induction transistors and field effect transistors both of which including junction type, Schottky type, metal oxide semiconductor (MOS) type and metal insulator semiconductor (MIS) type. For example, in case the drain region of an SIT is constructed by an embedded region 62, high-speed operation can be performed by the provision of the drain region 62 via a high impurity concentration region 61 and a high resistivity region 66 as shown in FIG. 12. This structure of FIG. 12 permits the construction comprising an n+ type source region 62 and an n+ type drain region 65, which is the reverse of the arrangement just referred to above. In this latter instance, the distance between the p+ type gate region 64 and the n+ type source region 62 should be made smaller than that in the arrangement mentioned just above.

Figure 13A:
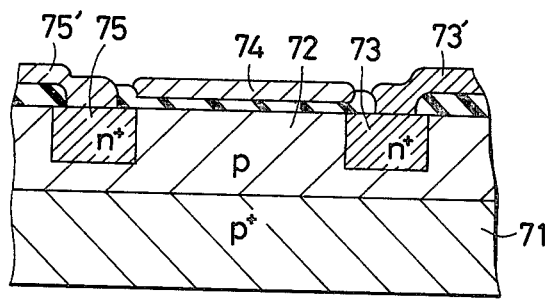
Figure 13B:
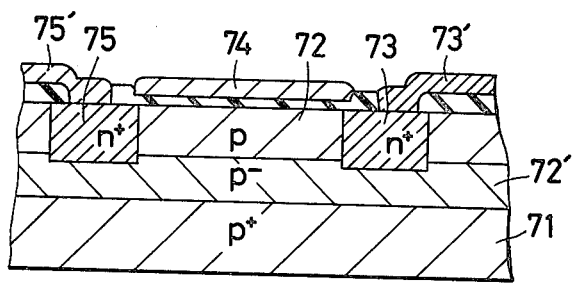

FIGS. 13A and 13B show instances in which the present invention is applied to MOS field effect transistor. In general, MOS field effect transistor is such that one of the source region 75 which in this example is of the n+ type (or the source electrode 75') and the drain region 73 which in this example is of the n+ type (or the drain electrode 73') is kept at a certain constant potential which may be either the ground potential or the potential of a power source, whereas the potential of the other electrode varies in accordance with the changes of the operative state of the device. In the conventional art, the large capacitance between the source region 75 and the substrate 71 or between the drain region 73 and the substrate 71 has been accepted as constituting one of the deteriorating factors to limit the operation speed of the MOS field effect transistors. However, according to the structure shown in FIGS. 13A and 13B, the capacitance can be reduced and at the same time the conductance in high speed operation can be kept from developing. The structure shown in FIG. 13A is the so-called one-layer structure, whereas the structure of FIG. 13B is the so-called two-layer structure. The region between the substrate 71 and that region among the source region 75 and the drain region 73 which undergoes changes in its voltage in the operative state of the device is arranged so that this region is always depleted by the depletion layer in the main operative state of the device. In FIG. 13A, the distance or thickness of the p type region 72 located between the n+ type region 73 and the p+ type substrate 71 is so selected that this region is always depleted in the main operative state of the device. In the structure of FIG. 13B, in which a high resistivity region 72' is provided, the dimension and the impurity concentration of this p− type highly resistive region is so selected that the region 72' located between the substrate 71 and either the source region 75 or the drain region 73 which undergoes changes in its potential in the main operative state of the device becomes depleted in the main operative state without causing a punch-through current between the source region 75 and the drain region 73.

Figure 14:
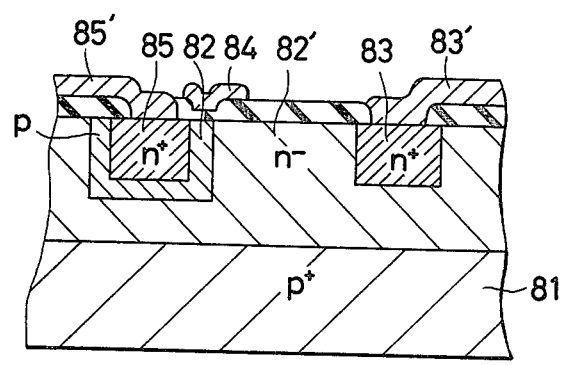

In the SIT of the metal oxide semiconductor type shown in FIG. 14, there are provided an n+ type source region 85, an n+ type drain region 83, a p+ type substrate 81, an n− type high resistivity region 82', a p type region 82 surrounding the n+ type source region 85, and electrodes 85', 84 and 83'. In this structure, the above-mentioned advantageous property of high-speed operation can be obtained without deteriorating the characteristics of the device, like other embodiments described previously.

The embodiments described above concern several examples of the present invention. It should be understood that the present invention is not limited to these embodiments, but that, needless to say, the present invention can be applied equally effectively to instances wherein the conductivity types of the respective parts are completely reversed, and that the present invention can be applied effectively to any combination of MOS-SIT and MOS-FET or the like.

That part of the device wherein a junction type SIT is used can be substituted by such bipolar transistor in which the base region is almost or completely pinched off and in which the device is rendered to the punch-through state. Such device also exerts a desirable operation like other embodiments of the present invention.

The semiconductor devices according to the embodiments of the present invention can be manufactured by relying on known techniques such as crystal growth technique (including selective growth technique), fine processing technique, selective diffusion technique, selective etching technique, ion implantation technique and like techniques.

The transistor structure which has an embedded electrode and which contains a low resistivity region having a conductivity type opposite to that of said embedded electrode and formed under said embedded electrode via a high resistivity region intervening between the embedded electrode and this low resistivity region further enhances the high operation of the transistor, and at the same time makes it easy to manufacture an integrated circuit containing bipolar transistors, field effect transistors and static induction transistors in a same semiconductor chip. According to the present invention, a circuitry which can be directly connected with other circuit due to the inherent high input impedance can be composed, and furthermore the present invention makes it much easier than by conventional techniques to arbitrarily combine an SIT having the property of exerting high-speed operation at low power dissipation with a bipolar transistor having the property of exerting high-speed operation and great driving ability though large in power dissipation, in a same semiconductor chip, thus materializing high-speed operations of wide variety.

In case an insulator isolation techniques such as the isoplanar technique and the like is employed, the high resistivity region may have same conductivity type as that of the embedded layer, or alternatively this high resistivity region may be formed by an instrinsic semiconductor layer.

In FIGS. 3, 12A and 12B, the high resistivity region has been described and shown to extend on the entire surface of the low resistivity substrate. It should be understood, however, that substantially the same effect can be obtained also from the arrangement that this high resistivity region is provided only in that portion located under the electrode region.

The transistors according to the present invention can also be applied effectively to known circuitries such as emitter-coupled logic (ECL) circuit, emitter-follower logic (EFL) circuit, non-threshold logic (NTL) circuit, transistor-transistor logic (TTL) circuit, integrated injection logic (IIL) circuit, resistor-transistor logic (RTL) circuit, and further to dynamic random access memory (RAM) circuit, static random access memory (S-RAM) circuit, read-only memory (ROM) circuit and like circuitries.

Also, as mentioned before, any combination, in an identical semiconductor chip, of bipolar transistors as well as field effect transistors (FET) which both exhibit constant current characteristic, with static induction transistors (SIT) which exhibit constant voltage characteristic will markedly expand the freedom of the circuit designing, thus bringing forth great advantages, merits and values in the industrial field.

Also, the value of the semiconductor integrated circuit in which an SIT and a bipolar transistor are provided in any combination, is extremely high in that the bipolar transistor having properties of high-speed operation and great driving ability can be arranged, as an interface circuit section, in a same semiconductor chip almost without requiring any additional special process.

What is claimed is:

1. A semiconductor device formed in a semiconductor chip and including at least one semiconductor element:

said element including first and second portions defining a controlled current path therebetween, and means for controlling current flow through said path, wherein said first portion comprises;
a first semiconductor region having a predetermined impurity concentration said device including:
a second semiconductor region of a second predetermined impurity concentration disposed outside of and in the neighborhood of said first semiconductor region; and
a third semiconductor region disposed between said first and second semiconductor regions, said third semiconductor region having a predetermined width and a conductivity type opposite to at least one of said first and second semiconductor regions and forming a P-N junction therewith, said third semiconductor region having an impurity concentration lower than said first and second predetermined impurity concentration, and; means, including said P-N junction for generating a depletion layer in said third semiconductor region to substantially deplete said third semiconductor region.

2. A semiconductor device according to claim 1, wherein: said semiconductor chip has a first and a second principal surface, said second semiconductor region is exposed in a large area to said second principal surface, and said at least one semiconductor element is exposed to said first principal surface.

3. A semiconductor device according to claim 2, wherein: said first semiconductor region has an inner portion facing said second semiconductor region substantially in parallel with said second principal surface in a small area.

4. A semiconductor device according to claim 3, wherein: said iner portion of said first semiconductor region is disposed remotest from said first principal surface within said at least one semiconductor element.

5. A semiconductor device according to claim 4 wherein: said first semiconductor region has an inner portion embedded in said semiconductor chip.

6. A semiconductor device according to claim 1, 2, 3, 4 or 5, wherein: the impurity concentration of said first and said second semiconductor regions is at least two orders of magnitude higher than that of said third semiconductor region.

7. A semiconductor device according to claim 6, wherein: said first and said second semiconductor regions have opposite conductivity type.

8. A semiconductor device according to claim 7, wherein: said semiconductor device is a bipolar transistor having a base region, a collector region and an emitter region, and said first semiconductor region is said collector region or said emitter region.

9. A semiconductor device according to claim 7, wherein: said semiconductor device is a static induction transistor having a source region, a gate region and a drain region, and said first semiconductor region is said source region or said drain region.

10. A semiconductor device according to claim 7, wherein: said semiconductor device is a junction field effect transistor having a source region, a gate region and a drain region, and said first semiconductor region is said source region or said drain region.

11. A semiconductor device according to claim 7, wherein: said semiconductor device is a field effect transistor of an insulated gate structure type having a source region, a gate region and a drain region, and said first semiconductor region is said source region or said drain region.

12. A semiconductor device according to claim 6, wherein: said insulated gate structure type is the metal oxide semiconductor type.

13. A semiconductor device according to claim 6, wherein: said insulated gate structure type is the metal insulator semiconductor type.

14. A semiconductor device according to claim 11, wherein: said insulated gate structure type is the Schottky contact type.

15. A semiconductor device according to claim 11, wherein: said insulated gate structure type is one which has a gate electrode formed by polycrystalline silicon.

16. A semiconductor device according to claim 7, wherein: said semiconductor device is a static induction transistor of an insulated gate structure type having a source region, a gate region and a drain region, and said first semiconductor region is said source region or said drain region.

17. A semiconductor device according to claim 16, wherein: said insulated gate structure type is the metal oxide semiconductor type.

18. A semiconductor device according to claim 16, wherein: said insulated gate structure type is the metal insulator semiconductor type.

19. A semiconductor device according to claim 16, wherein: said insulated gate structure type is the Schottky contact type.

20. A semiconductor device according to claim 16, wherein: said insulated gate structure type is one which has a gate electrode formed by polycrystalline silicon.

21. A semiconductor device according to claim 1, wherein: the impurity concentration of said first and second semiconductor regions are at least two order of magnitude higher than that of said third semiconductor region.

22. A semiconductor chip including a semiconductor substrate and an epitaxial layer formed on the substrate,: said substrate having a high impurity concentration and a certain conductivity type, and said epitaxial layer having a low impurity concentration; said chip comprising:
a transistor having respective semiconductor regions formed in said epitaxial layer, and including a heavily-doped region having a portion located nearest to said substrate separated from said substrate by a predetermined distance and having a conductivity type opposite to said certain conductivity type, and,
a part of said epitaxial layer being sandwiched between said substrate and said portiion of the heavily-doped region and forming a P-N junction with one thereof; and means, including said P-N junction for generating a depletion layer in said part to substantially occupy said part of the epitaxial layer.

23. A transistor according to claim 22, wherein: said portion of the heavily-doped region is embedded in said epitaxial layer and constitutes a current electrode region, and the respective semiconductor regions of said transistor includes another current electrode region formed in a surface portion of said epitaxial layer above said portion of the heavily-doped region.

24. A semiconductor integrated circuit structure formed in a semiconductor chip having a first and a second principal surface,
said integrated circuit including a transistor having at least one input terminal connected to a signal source and at least one output terminal connected to a load, said transistor further including a first semiconductor region having a high impurity concentration and connected to one of said terminals, said chip including a second semiconductor region having a high impurity concentration and disposed outside of said transistor in the neighborhood of said first semiconductor region, and a third semiconductor region having a high resistivity and of a conductivity type opposite to that of at least one of said first and second semiconduction regions and forming a P-N junction therewith and disposed outside of said transistor and between said first and second semiconductor region, and means including said P-N junction to generate a depletion layer in said third semiconductor region to substantially deplete the third semiconductor region in a main operative state of said integrated circuit.

25. A semiconductor integrated circuit structure according to claim 24, wherein: said second semiconductor region is formed with a common semiconductor region in said semiconductor chip and exposed to said second principal surface.

26. A semiconductor integrated circuit structure according to claim 25, wherein: said at least one input terminal and said at least one output terminal include respective electrodes of a conducting material formed on said first principal surface.

27. A semiconductor integrated circuit structure according to claim 25, wherein: said semiconductor chip includes a semiconductor substrate which includes said first semiconductor region.

28. A semiconductor integrated circuit structure according to claim 25, wherein: said semiconductor chip includes a substrate and an epitaxial layer formed on the substrate, said second semiconductor region is formed with said substrate, and said epitaxial layer includes a portion constituting said third semiconductor region.

29. A semiconductor integrated circuit structure according to claim 28, wherein: said transistor is totally formed in said epitaxial layer.

30. A semiconductor integrated circuit structure according to claim 29, wherein: said third semiconductor region is that part of said epitaxial layer which is sandwiched between said transistor and said substrate.

* * * * *

UNITED STATES PATENT AND TRADEMARK OFFICE
CERTIFICATE OF CORRECTION

PATENT NO. : 4,266,238

DATED : May 5, 1981

INVENTOR(S) : Jun-ichi Nishizawa

It is certified that error appears in the above—identified patent and that said Letters Patent is hereby corrected as shown below:

Column 1, line 30, "EEL" should read -- EFL --.

Column 2, lines 15 and 16, delete "capable of making a high speed"

Column 3, line 67, "rc" should read -- rC --.

Column 4, line 8, "µv" should read --µΩ -- (both times)

Column 15, line 34, "iner" should read -- inner --.

Column 16, lines 1 and 4, "Claims 6" should read -- claim 11 --.

Column 17, line 10, "semiconduction" should read -- semiconductor --.

Column 18, line 9, "first" should read -- second --.

Signed and Sealed this

Twenty-fifth Day of May 1982

[SEAL]

Attest:

Attesting Officer

GERALD J. MOSSINGHOFF

Commissioner of Patents and Trademarks